US006819272B2

(12) United States Patent
Ghildiyal

(10) Patent No.: US 6,819,272 B2
(45) Date of Patent: Nov. 16, 2004

(54) SYSTEM, METHOD AND COMPUTER READABLE MEDIUM FOR COMPRESSING A DATA SEQUENCE FOR PARTIAL DECOMPRESSING

(75) Inventor: Ramkrishna Ghildiyal, Karnataka (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/289,752

(22) Filed: Nov. 6, 2002

(65) Prior Publication Data

US 2004/0085232 A1 May 6, 2004

(51) Int. Cl.$^7$ .......................... H03M 7/34; H03M 7/38; H03M 7/30
(52) U.S. Cl. ......................................... 341/87; 341/51
(58) Field of Search ............................. 341/50, 51, 67, 341/87, 95; 704/211; 707/101; 711/170; 712/24

(56) References Cited

U.S. PATENT DOCUMENTS

| | | | |
|---|---|---|---|
| 4,558,302 A | | 12/1985 | Welch |
| 4,701,745 A | | 10/1987 | Waterworth |
| 4,814,746 A | | 3/1989 | Miller et al. |
| 5,760,716 A | * | 6/1998 | Mathews et al. ............. 341/50 |
| 5,813,011 A | * | 9/1998 | Yoshida et al. ............. 707/101 |
| 6,195,741 B1 | * | 2/2001 | Asato .......................... 712/24 |
| 6,236,960 B1 | * | 5/2001 | Peng et al. .................. 704/211 |
| 6,271,776 B1 | * | 8/2001 | Turk et al. ..................... 341/95 |
| 6,279,092 B1 | * | 8/2001 | Franaszek et al. .......... 711/170 |
| 6,396,420 B1 | * | 5/2002 | Augustine .................... 341/50 |
| 6,501,395 B1 | * | 12/2002 | Ghildiyal ..................... 341/51 |

FOREIGN PATENT DOCUMENTS

WO     WO 02/08956     * 1/2002

* cited by examiner

*Primary Examiner*—Patrick Wamsley

(57) ABSTRACT

A method for compressing an input sequence of data portions to produce an output codestream and for partially decompressing the output codestream to obtain a selected segment of the input sequence is disclosed. The output codestream includes a sequence of non-matchable sequences and codewords. The codewords include a first codeword and subsequent codewords. Each of the codewords includes at least a length of a subsequent non-matchable sequence preceding a matchable first sequence. Each of the subsequent codewords further includes a first offset for indicating a start of the matchable first sequence in the preceding non-matchable sequence, a length of the matchable first sequence and a second offset for indicating a location of a preceding codeword in the output codestream. A program storage device and a compressing/decompressing system for providing the above method are also disclosed.

12 Claims, 5 Drawing Sheets

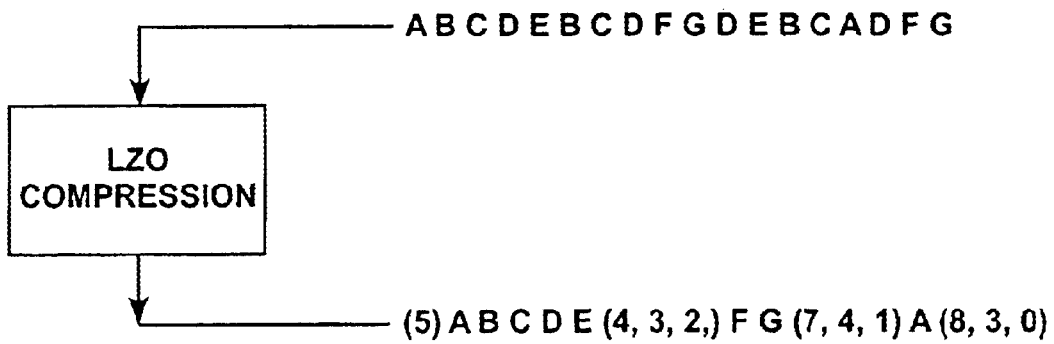
Figure 1
(Prior Art)
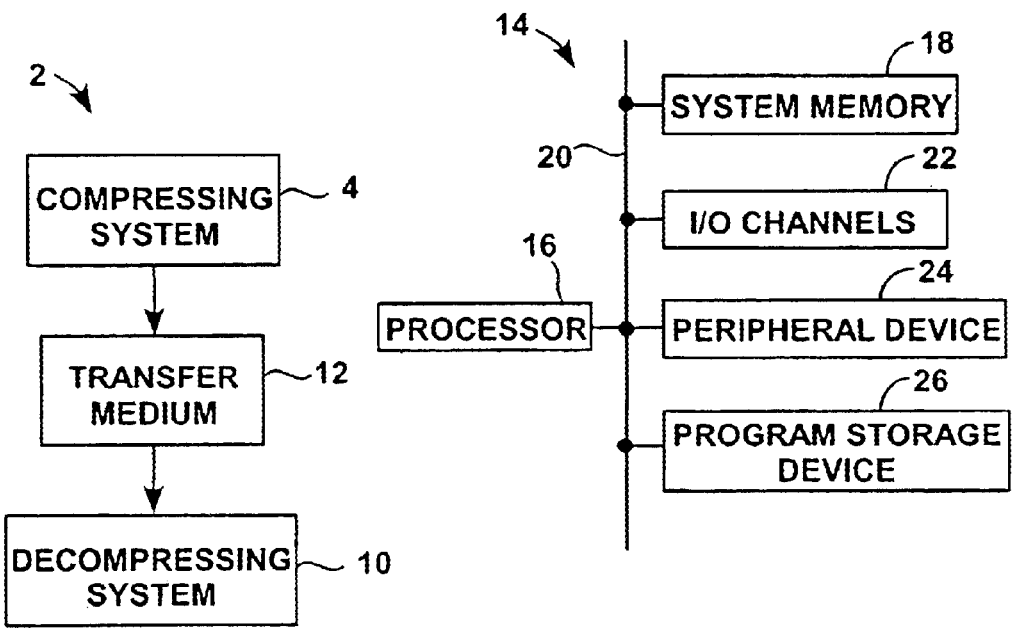
Figure 2
Figure 3

SYSTEM, METHOD AND COMPUTER READABLE MEDIUM FOR COMPRESSING A DATA SEQUENCE FOR PARTIAL DECOMPRESSING

BACKGROUND

This invention relates to data compression, and more particularly, to a system and a method for compressing a data sequence to produce an output codestream that allows partial decompressing to obtain an intermediate segment of the data sequence.

Data compression techniques are used to reduce the amount of data to be stored or transmitted in order to reduce the storage capacity and transmission time respectively. In either case it is necessary to provide a corresponding decompression technique to enable the original data to be reconstructed.

Many data compression and decompression techniques are known, with the Lempel-Ziv (LZ) technique and its variants proving to be very popular. U.S. Pat. No. 4,558,302, Welch, entitled "High Speed Data Compression and Decompression Apparatus and Method;" U.S. Pat. No. 4,701,745, Waterworth, entitled "Data Compression System;" and U.S. Pat. No. 4,814,746, Miller et al., entitled "Data Compression Method" are patents that disclose some of these LZ techniques. One of the LZ variants is known as the LZ Opperhumer (LZO) technique. FIG. 1 shows an output codestream obtained by compressing an input character sequence using the LZO technique. The output codestream includes codewords interspersed with non-matchable sequences of characters from the input character sequence. The codewords reference sequences of characters which have previously appeared when decompressing the output codestream to allow the original input character sequence to be rebuilt from the codestream.

The LZ techniques are known as a dictionary-based technique. In this technique, a running dictionary is generated during both compression and decompression. To obtain an intermediate segment of an input character sequence from an output codestream, it is necessary to begin decompression from the start of the output codestream until the desired intermediate segment is obtained. Partial decompression of the output codestream is not possible with the prior art LZ techniques.

SUMMARY

According to an aspect of the present invention, there is provided a method for compressing an input sequence of data portions to produce an output codestream and for partially decompressing the output codestream to obtain a selected segment of the input sequence. The method includes compressing the input sequence to produce the output codestream of non-matchable sequences and codewords. The codewords include a first codeword and subsequent codewords. Each of the codewords includes at least a length of a non-matchable sequence preceding a matchable first sequence. Each of the subsequent codewords further includes a first offset for indicating a start of the matchable first sequence in the preceding non-matchable sequence, a length of the matchable first sequence and a second offset for indicating a location of a preceding codeword in the output codestream.

According to another aspect of the present invention, there is provided a compressing/decompressing system having means for compressing an input sequence of data portions as described above.

According to another aspect of the present invention, there is provided a program storage device readable by a computing device. The program storage device tangibly embodies a program of instructions that is executable by the computing device to perform the above method for compressing/decompressing an input sequence of data portions.

BRIEF DESCRIPTION OF DRAWINGS

The invention will be better understood with reference to the drawings, in which:

FIG. 1 is a schematic drawing showing a character sequence and an output codestream obtained by compressing the character sequence using a prior art Lempel-Ziv-Oberhumer (LZO) technique;

FIG. 2 is a schematic diagram of a data compression/decompression system including a compressing system that compresses a data sequence into a codestream, according to an embodiment of the present invention, for transferring to a decompressing system;

FIG. 3 is a block diagram showing typical hardware elements of a computing system that may be used as the compressing system and decompressing system in FIG. 2;

DETAILED DESCRIPTION

Figure 4:
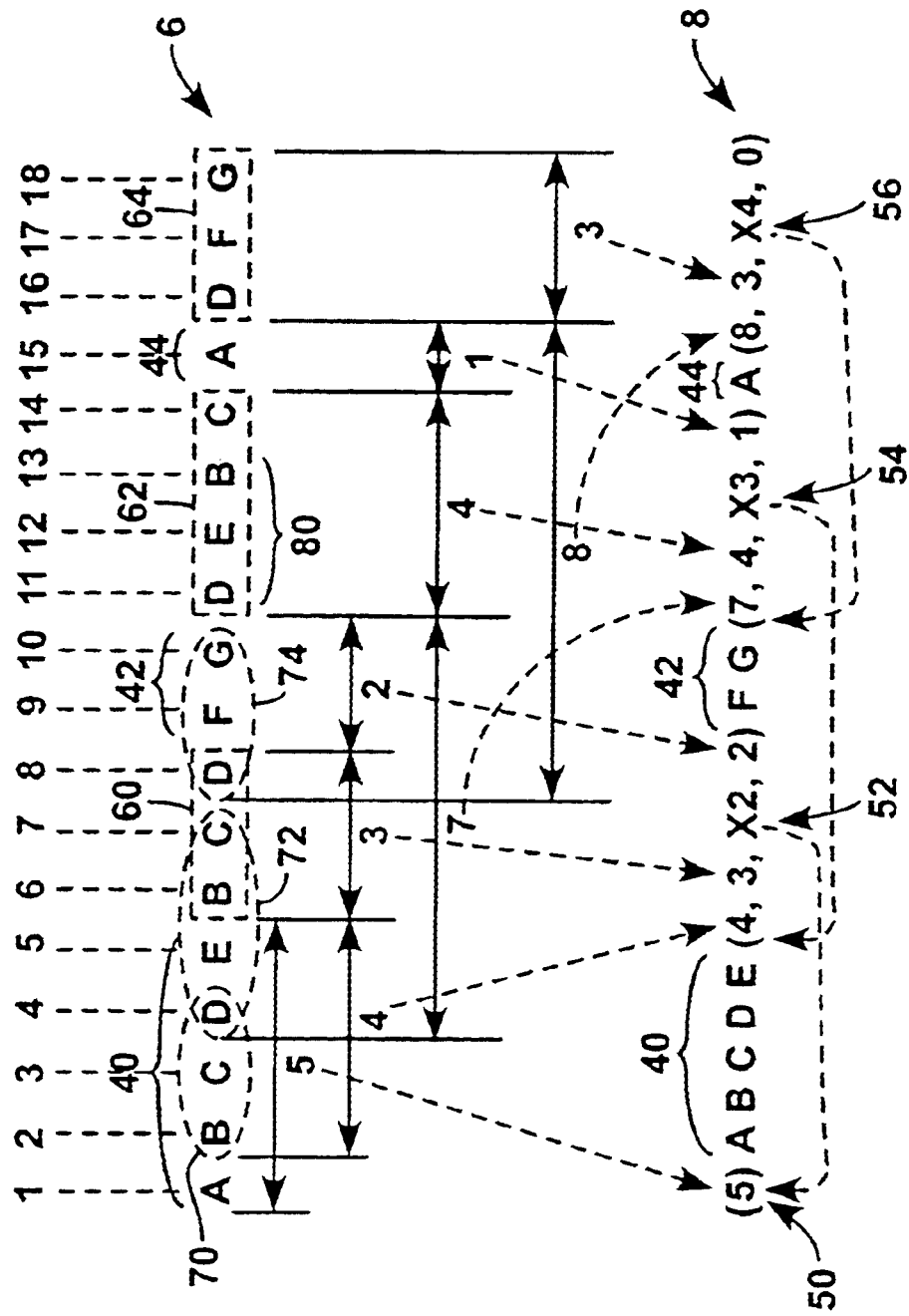
FIG. 4 is a schematic drawing showing an output codestream obtained by compressing the character sequence in FIG. 1 using the compressing system in FIG. 2.

FIG. 2 is a schematic drawing illustrating a data compressing/decompressing system 2 incorporated with the teachings of the present invention. The system includes a compressing system 4 having means therein that compresses an input sequence of portions of data, such as bytes of data representing a character sequence 6 (FIG. 4), into an output codestream 8 (FIG. 4) for transferring to a decompressing system 10 via a transfer medium 12. The decompressing system 10 receives the codestream 8 and is able to partially decompress or expand the codestream 8 to reconstruct a selected segment of the character sequence 6.

FIG. 3 is a block diagram illustrating typical elements of a computing system 14 that may be appropriately programmed to function as the compressing system 4 and the decompressing system 10. The elements include a programmable processor 16 connected to a system memory 18 via a system bus 20. The processor 16 accesses the system memory 18 as well as other input/output (I/O) channels 22 and peripheral devices 24. The computing system 14 further includes at least one program storage device 26, such as a CD-ROM, tape, magnetic media, EPROM, EEPROM, ROM or the like. The computing system stores one or more computer programs that implement a method of compressing a data sequence according to an embodiment of the present invention. The processor 16 reads and executes the one or more computer programs to perform the method. Each of the computer programs may be implemented in any desired computer programming language (including machine, assembly, high level procedural, and object oriented programming languages). In any case, the language may be a compiled or interpreted language.

FIG. 4 shows the output codestream 8 that is obtained by compressing the character sequence 6 using the method. Broadly, the compressing system 4 compresses the input sequence 6 to produce an output codestream 8 of non-matchable sequences 40, 42, 44 and codewords 50, 52, 54, 56. The codewords 50, 52, 54, 56 include a first codeword 50 and subsequent codewords 52, 54, 56. The codewords 50, 52, 54, 56 include at least a length of a non-matchable sequence 40, 42, 44 preceding a matchable first sequence 60, 62, 64. The subsequent codewords 52, 54, 56 further include a first offset that indicates a start of the matchable first sequence 60, 62, 64 in a preceding non-matchable sequence 40, 42, 44, a length of the matchable first sequence 40, 42, 44 and a second offset that indicates a distance between a codeword 52, 54, 56 and a preceding codeword 50, 52, 54.

The compressing system 4 compresses the character sequence 6 by sequentially traversing the character sequence 6 byte by byte, if each character is stored in a byte, to determine if a first sequence of bytes starting with each traversed byte is matchable with a second sequence of previously traversed bytes. If a first sequence 60, 62, 64 is matchable with a second sequence 70, 72, 74, the compressing system 4 notes a length, in bytes, of the first sequence 60, 62, 64 and an offset, in bytes, between the start of the first sequence 60, 62, 64 and a corresponding second sequence 70, 72, 74. The compressing system 4 also records any non-matchable sequence 40, 42, 44 of bytes in the character sequence 6. When the character sequence 6 is completely traversed, the output codestream 8 of alternating codewords 50, 52, 54, 56 and non-matchable sequences 40, 42, 44 is generated. This output codestream 8 of codewords 50, 52, 54, 56 and non-matchable sequences 40, 42, 44 defines compressed data of the character sequence 6. The codewords 50, 52, 54, 56 and the non-matchable sequences 40, 42, 44 are ordered in the sequence they are computed.

Figure 5:
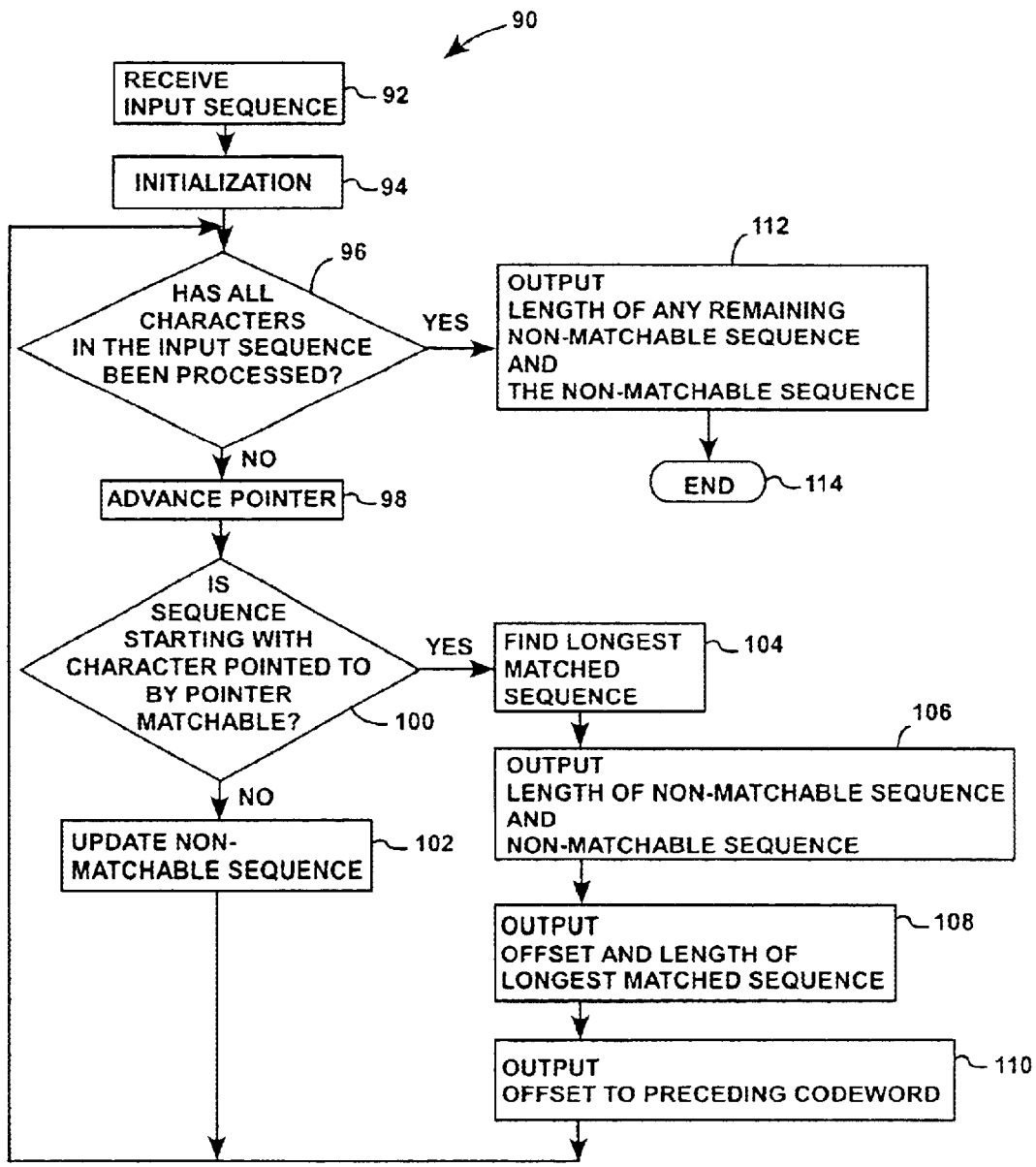
FIG. 5 is a flowchart showing a sequence of steps in the compressing system in FIG. 2 for compressing the character sequence.

FIG. 5 is a flowchart showing a sequence 90 of steps in the method for compressing the character sequence 6 using the compressing system 4. This compression sequence 90 will be described according to a sequence in which it traverses or processes the character sequence 6. The compression sequence 90 starts with a RECEIVE INPUT SEQUENCE step 92, wherein the compressing system 4 receives the character sequence 6. The character sequence 6 in FIG. 4 includes eighteen characters numbered according to their positions in the character sequence 6. After receiving the character sequence 6 the compression sequence 90 proceeds to an INITIALIZATION step 94, wherein a pointer (not shown) is initialized to point to a character position before the first character "A" in the character sequence 6.

The compression sequence 90 next proceeds to a DETERMINE IF INPUT SEQUENCE IS EXHAUSTED step 96, wherein the compressing system 4 determines if all the characters in the character sequence 6 have been completely processed. If it is determined in this step 96 that there are characters remaining in the character sequence 6 for processing, the compression sequence 90 proceeds to an ADVANCE POINTER step 98. In this step 98, the compressing system 4 advances the pointer by a character position to point to the next character in the character sequence 6. At this point of processing the character sequence 6, the pointer is advanced to point to the character "A" ($1^{st}$ character). The compression sequence 90 next proceeds to a CHECK FOR MATCHING SEQUENCE step 100. In this step 100, the compressing system 4 determines if a first sequence of a predetermined minimum number of characters starting with the character pointed to by the pointer is matchable with a second sequence of previously traversed or processed characters. Matching is performed using a hashing method that has been used in other LZ techniques.

If it is determined according to the CHECK FOR MATCHING SEQUENCE step 100 that there is no matching sequence, the compression sequence 60 proceeds to an UPDATE NON-MATCHABLE SEQUENCE step 102, wherein the compressing system 4 increments a non-matchable character counter (not shown). The compression sequence 90 then returns to the DETERMINE IF INPUT SEQUENCE IS EXHAUSTED step 96. The compression sequence 90 loops around the steps 96–102 when processing the first non-matchable sequence, "ABCDE" ($1^{st}$-$5^{th}$ character), of the character sequence 6 until the pointer is advanced to point, in the ADVANCE POINTER step 98, to the $6^{th}$ character "B". At this point, the non-matchable character counter would have been incremented to a value of five because of the number of characters or length of the non-matchable sequence "ABCDE".

If it is DETERMINED in the CHECK FOR MATCHING SEQUENCE step 100 that there is a match between a first sequence of the predetermined minimum number of characters, for example three characters, and a second sequence, the compression sequence 90 will proceed to a FIND LONGEST MATCH step 104. Such will be the case when the sequence "BCD" ($6^{th}$-$8^{th}$ character) is encountered that is matched by another sequence of "BCD" ($2^{nd}$-$4^{th}$ character). In the FIND LONGEST MATCH step 74, the compressing system 4 determines the longest first sequence starting with the character pointed to by the pointer that is matched by a second sequence in the previously processed characters. At this point in the processing of the character sequence 6, the longest first sequence 60 is just the sequence "BCD" ($7^{th}$-$9^{th}$ characters). The compressing system 4 notes the first offset or the number of characters between the start of the two matching sequences 60, 40 and the length or the number of characters in one of these sequences 60, 40. The first offset and the length are four and three characters respectively for the matched first sequence "BCD" ($6^{th}$-$8^{th}$ characters).

The compression sequence 90 next proceeds to a FIRST OUTPUT STEP 106, wherein the compressing system 4 outputs the number of characters or length of the non-matchable sequence 40 to a buffer (not shown) in the system memory 18. For the non-matchable sequence "ABCDE" ($1^{st}$-$5^{th}$ characters), the value five from the non-matchable character counter is copied to the buffer. Also in the FIRST OUTPUT step 106, the compressing system 4 appends the sequence of non-matchable characters 40 to the buffer. At this point in the processing of the character sequence 6, the compressing system 4 appends the sequence "ABCDE" to the buffer.

The compression sequence 90 next proceeds to a SECOND OUTPUT step 108, wherein the compressing system 4 appends two data items, the first offset and the length of the matched first sequence 60, to the buffer. The compression system 4 next proceeds to a THIRD OUTPUT step 110, wherein the compressing system 4 appends a third data item, a second offset, to the buffer. This second offset allows the first codeword 50 to be located from the second codeword 52. The second offset is indicated as X2 in FIG. 4. The value of X2 is determined after the first codeword 50 has been coded. In this THIRD OUTPUT step 110, the compressing system 4 also advances the pointer accordingly and clears the non-matchable character counter.

The compression sequence 90 then returns to the DETERMINE IF INPUT SEQUENCE IS EXHAUSTED step 96 and repeats the above-described steps 96–102 until all the characters in the character sequence 6 have been processed. Specifically, the compression sequence 90 will repeat the steps 96–102 when processing the second non-matchable sequence "FG" ($9^{th}$-$10^{th}$ character). The compression sequence 90 proceeds to the FIND LONGEST MATCH step 104 when processing the sequence "DEB" ($11^{th}$-$13^{th}$ character) in the step 100 because it is matched by another sequence "DEB" ($4^{h}$-$6^{th}$ character). In the FIND LONGEST MATCH step 74, the longest matched sequence is determined to be the sequence "DEBG" ($11^{th}$-$14^{th}$ characters). The first offset associated with this sequence "DEBG" is seven and the length of the sequence is four.

The compressing system 4 appends a data item of a value of two which is the length of the non-matching sequence "FG" to the buffer in the FIRST OUTPUT step 106. This data item together with the preceding three data items forms the second codeword 52. The compressing system 4 next appends the second non-matching sequence 42 and the data items of values seven and four to the buffer in the SECOND OUPUT step 108 to begin to form the third codeword 54. The compressing system 4 next appends another second offset, indicated as X3 in FIG. 4, to the buffer in the THIRD output step 110 to further add to the third codeword 54.

Similarly, the remaining sequence "ADFG" ($15^{th}$-$18^{th}$ character) of the character sequence 6 is processed using the compression sequence 90. The processing of the sequence "DFG" ($16^{th}$-$18^{nd}$ character) results in the writing of a value one to the buffer to complete the third codeword 54. The processing of the sequence "DFG" also results in the writing of the non-matching sequence 44 and of a fourth codeword 56 having the first three data items of values eight, three and one to the buffer.

When there is no more characters left in the character sequence 6 to be processed as determined in the DETERMINE IF INPUT SEQUENCE IS EXHAUSTED step 96, the compression sequence 90 proceeds to a FOURTH output step 112, wherein the compressing system 4 writes a length of a remaining non-matchable sequence and the remaining non-matchable sequence itself to the buffer. For the case of the character sequence 6, there is no remaining non-matchable sequence after the entire character sequence 6 is processed. The compressing system 4 therefore appends a data item of value zero to the buffer to complete the fourth and final codeword 56. The compression sequence 90 finally ends in an END step 114, wherein the compressed data or codestream defined by the codewords 50, 52, 54, 56 and the non-matchable sequences 40, 42, 44 is ready for use, such as for transmission via the transfer medium 12 to the decompressing system 10 (FIG. 2). Any known coding format may be used for coding the data items in the codewords 50, 52, 54, 56.

Figure 6:
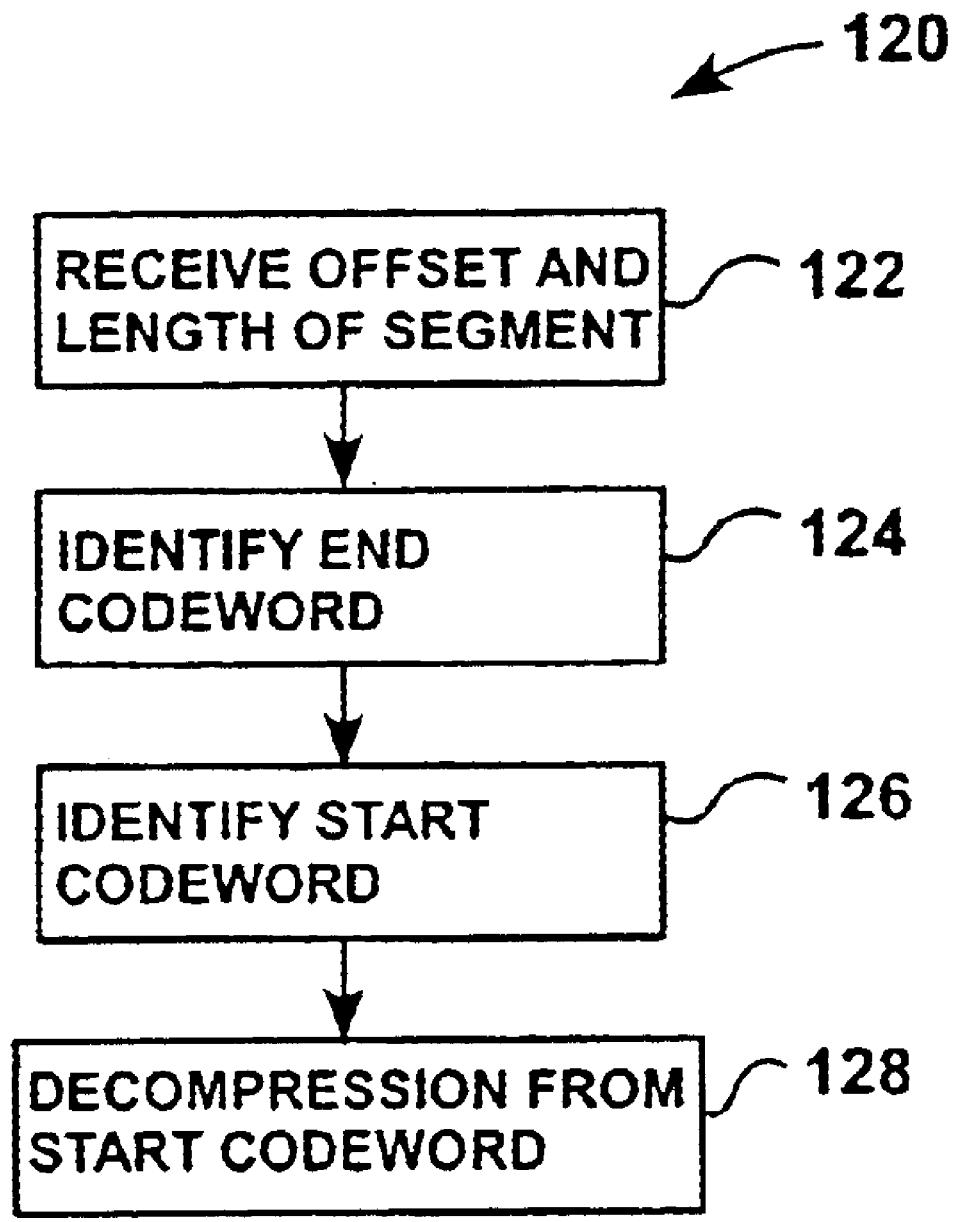
FIG. 6 is a flowchart showing a sequence of steps in the decompressing system in FIG. 2 for partially decompressing the output codestream in FIG. 4.
Figure 7:
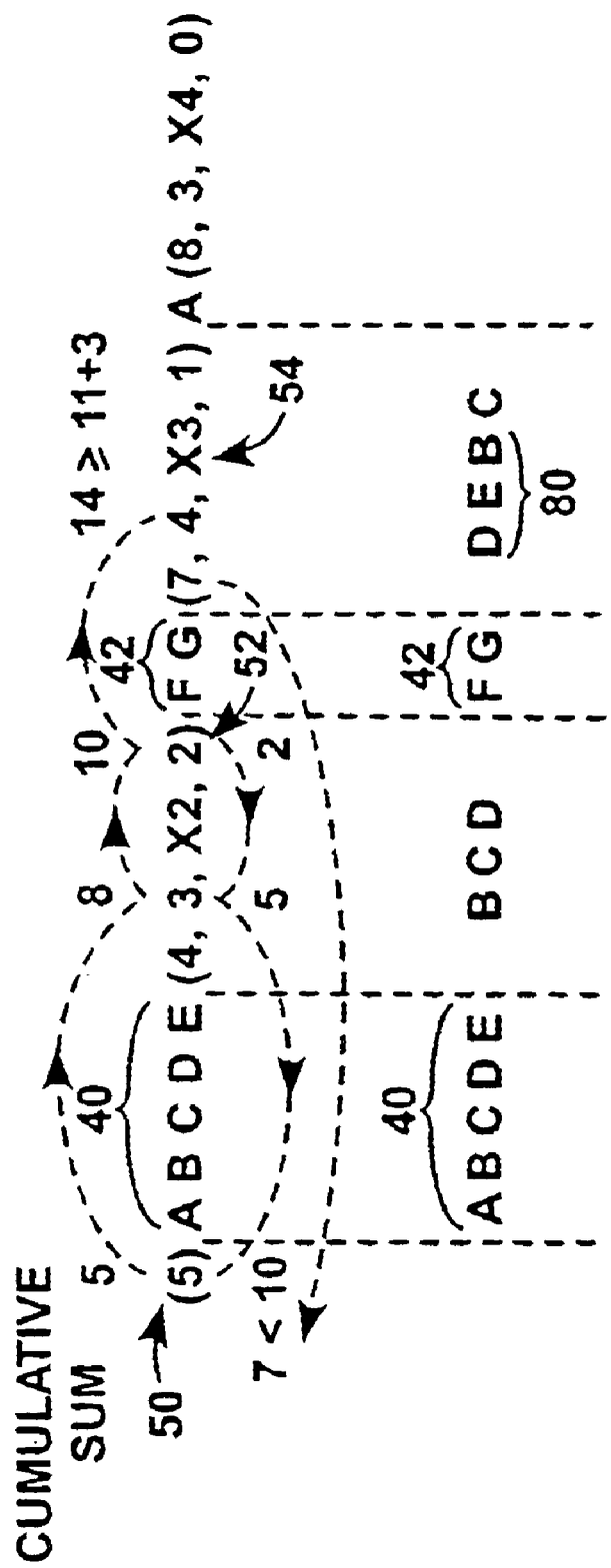
FIG. 7 is a schematic drawing showing partial decompression of the output codestream in FIG. 4, according to the sequence in FIG. 6, to obtain a selected segment of the character sequence.

The partial decompression of the output codestream 8 to obtain a selected segment 80 of the character sequence 6 is next described in detail with the aid of FIGS. 6 and 7. FIG. 6 is a flowchart showing a sequence 120 of steps in the decompressing system 10 for partial decompressing the output codestream 8 to obtain the selected segment 80 (FIG. 4) of the character sequence 6. This decompression sequence 120 will be described according to a sequence in which it processes the output codestream 8 as illustrated in FIG. 7. The decompression sequence 120 starts with a RECEIVE OFFSET AND LENGTH OF SEGMENT step 122, wherein the decompressing system 10 receives a length of the selected segment 80 and its offset from a start of the character sequence 6. In this case, the selected segment 80 in the character sequence 6 has an offset of eleven and a length of three.

The decompression sequence 120 next proceeds to an IDENTIFY END CODEWORD step 124, wherein the decompressing system 10 identifies an end codeword in the output codestream 8 that encodes an end of the selected segment 80. The decompressing system 10 sequentially traverses the codewords 50, 52, 54, 56 to add in turn the length of a non-matchable sequence and the length of the matchable first sequence, if one exists, in each codeword 50, 52, 54, 56 until a sum thereof covers the offset and the length of the selected segment 80. Adding these lengths in the first codeword 50 and the second codeword 52 yields a sum of ten which is less than the segment offset (value of eleven). The further addition of the length value four in the third codeword 54 to the sum brings the sum to fourteen, which now equals the sum of the segment offset and length. The third codeword 54 is therefore identified as the end codeword. The end codeword 54 in this case encodes the entire segment 80.

The decompression sequence 120 next proceeds to an IDENTIFY STARTCODEWORD step 126, wherein the decompressing system 10 traverses the codewords 50, 52, 54, 56 in a reverse order using the second offset of each codeword to identify a start codeword 50, 52, 54, 56 from which the selected segment 80 can eventually be reconstructed. In this case, the decompressing system 10 is able to determine from the end codeword 54 that a sequence encoded thereby can be decoded by obtaining four consecutive characters, the first character of which is seven characters away from an end of a preceding decompressed character sequence. However, the non-matching sequence 42 preceding the end codeword 54 is only two characters long and is therefore insufficient for the end codeword 54 to be decoded therefrom. It is therefore necessary for the decompressing system 10 to back track towards the beginning of the output codestream 8 in search of the start codeword. From the second offset X3 of the end codeword 54, the decompressing system 10 is able to locate a preceding codeword, in this case the second codeword 52. Similarly, the decompressing system 10 is able to determine from the second codeword 52 that three characters are encoded by the second codeword 52. These three characters can be decoded by obtaining three consecutive characters, the first of which is four characters away from an end of a preceding decompressed character sequence. Further back tracking is therefore necessary to obtain these three characters. From the second offset X2 of the second codeword 52, the decompressing system 10 is able to locate another codeword preceding the second codeword 52, in this case locating the first codeword 50. Since this is the first codeword 50 of the output codestream 8, the decompressing system 10 cannot back track any further. The first codeword 50 is thus identified as the start codeword.

The decompression sequence 120 finally ends in a DECOMPRESS FROM START CODEWORD step 128, wherein the decompressing system 10 decompresses the output codestream 8 from a starting non-matchable sequence 40 following the identified start codeword 50 until the selected segment 80 is obtained. The decoded sequence begins with the first non-matchable sequence 40. The three characters "BCD" encoded by the second codeword 52 are decoded from the first non-matchable sequence 40. Two characters in the non-matching sequence 42 following the second codeword 52 are added to the decoded sequence. From this decoded sequence, the four characters "DEBC" encoded by the end codeword 54 are decoded. The first three of the four characters constitute the segment 80. In this particular example, back tracking to the first codeword 50 at the start of the output codestream 8 is necessary to identify the starting non-matchable sequence. However, such back tracking to the beginning of the output codestream 8 is not always necessary.

Advantageously, the compression/decompression method described above allows partial decompression of an output codesteam to obtain an intermediate segment of an input sequence.

Although the present invention is described as implemented in the above-described embodiment, it is not to be construed to be limited as such. For example, instead of processing the input sequence byte by byte, the input sequence may be processed using data portions of other lengths.

As another example, the codewords may be kept separate from the non-matchable sequences instead of being interspersed with the non-matchable sequences. As yet another example, the second offset in the codewords need not be the length of a preceding non-matchable sequence as described above. The second offset of a codeword may be a number of bytes between the start of the codeword and the start of a preceding codeword.

I claim:

1. A method for compressing an input sequence of data portions to produce an output codestream that can be partially decompressed to obtain a selected segment of the input sequence, the method comprising:

compressing the input sequence to produce the output codestream of non-matchable sequences and codewords, wherein the codewords include a first codeword and subsequent codewords, the codewords including at least a length of a non-matchable sequence preceding a matchable first sequence and the subsequent codewords further including:
a first offset for indicating a start of the matchable first sequence in the preceding non-matchable sequence;
a length of the matchable first sequence; and
a second offset for indicating a location of a preceding codeword in the output codestream.

2. A method according to claim 1, further including:
receiving a length of the selected segment of the input sequence and its offset from a start of the input sequence;
identifying an end codeword in the output code stream that encodes an end of the selected segment;
traversing the codewords using the second offset to identify a starting non-matchable sequence; and
decompressing the output codestream from the identified starting non-matchable sequence until the selected segment is obtained.

3. A method according to claim 2, wherein identifying an end codeword in the output codestream that encodes an end of the segment includes:
sequentially traversing the codewords to add in turn the length of a non-matchable sequence and the length of the matchable first sequence of each codeword until a sum thereof covers the offset and the length of the selected segment.

4. A method according to claim 1, wherein the output codestream of nonmatchable sequences and codewords includes a sequence of alternating nonmatchable sequences and codewords.

5. A compressing/decompressing system for compressing an input sequence of data portions to produce an output codestream and for partially decompressing the output codestream to obtain a selected segment of the input sequence, the system comprising:

means for compressing the input sequence to produce the output codestream of non-matchable sequences and codewords, wherein the codewords include a first codeword and subsequent codewords, the codewords including at least a length of a nonmatchable sequence preceding a matchable first sequence and the subsequent codewords further including:
a first offset for indicating a start of the matchable first sequence in the preceding non-matchable sequence;
a length of the matchable first sequence; and
a second offset for indicating a location of a preceding codeword in the output codestream.

6. A compressing/decompressing system according to claim 5, further including:
means for receiving a length of the selected segment of the input sequence and its offset from a start of the input sequence;
means for identifying an end codeword in the output codestream that encodes an end of the selected segment;
means for traversing the codewords using the second offset to identify a starting non-matchable sequence; and
means for decompressing the output codestream from the identified starting non-matchable sequence until the selected segment is obtained.

7. A compressing/decompressing system according to claim 6, wherein means for identifying an end codeword in the output codestream that encodes an end of the segment includes:
means for sequentially traversing the codewords to add in turn the length of a non-matchable sequence and the length of the matchable first sequence of each codeword until a sum thereof covers the offset and the length of the selected segment.

8. A compressing/decompressing system according to claim 7, wherein the output codestream of non-matchable sequences and codewords includes a sequence of alternating non-matchable sequences and codewords.

9. A program storage device readable by a computing device, tangibly embodying a program of instructions, executable by the computing device to perform a method for compressing an input sequence of data portions to produce an output codestream and for partially decompressing the output codestream to obtain a selected segment of the input sequence, the method comprising:

compressing the input sequence to produce the output codestream of non-matchable sequences and codewords, wherein the codewords include a first codeword and subsequent codewords, the codewords including at least a length of a non-matchable sequence preceding a matchable first sequence and the subsequent codewords further including:
a first offset for indicating a start of the matchable first sequence in the preceding non-matchable sequence;
a length of the matchable first sequence; and
a second offset for indicating a location of a preceding codeword in the output codestream.

10. A program storage device according to claim 9, further including:
   receiving a length of the selected segment of the input sequence and its offset from a start of the input sequence;
   identifying an end codeword in the output codestream that encodes an end of the selected segment;
   traversing the codewords using the second offset to identify a starting non-matchable sequence; and
   decompressing the output codestream from the identified starting non-matchable sequence until the selected segment is obtained.

11. A program storage device according to claim 10, wherein identifying an end codeword in the output codestream that encodes an end of the segment includes:
   sequentially traversing the codewords to add in turn the length of a non-matchable sequence and the length of the matchable first sequence of each codeword until a sum thereof covers the offset and the length of the selected segment.

12. A program storage device to claim 9, wherein the output codestream of non-matchable sequences and codewords includes a sequence of alternating non-matchable sequences and codewords.

* * * * *